United States Patent [19]

Konuma

[11] Patent Number: 5,648,667

[45] Date of Patent: Jul. 15, 1997

[54] IMAGE PICKUP DEVICE WITH AND IMAGE PICKUP METHOD BY USE OF TWO-DIMENSIONALLY ARRANGED SENSORS HAVING SENSITIVITIES DIFFERENT IN CERTAIN DIRECTION OF ARRANGEMENT

[75] Inventor: Kazuo Konuma, Tokyo, Japan

[73] Assignee: NEC Corporation, Tokyo, Japan

[21] Appl. No.: 471,186

[22] Filed: Jun. 6, 1995

[30] Foreign Application Priority Data

Jun. 14, 1994 [JP] Japan ..................... 6-131513

[51] Int. Cl.$^6$ .................. H01L 27/148; H01L 29/768
[52] U.S. Cl. ................ 257/233; 257/229; 257/239; 257/455
[58] Field of Search .................. 257/223, 229, 257/231–233, 239, 222

[56] References Cited

U.S. PATENT DOCUMENTS

| | | | |
|---|---|---|---|
| 4,040,076 | 8/1977 | Kosonocky et al. | 257/229 |
| 4,667,213 | 5/1987 | Kosonocky | 257/233 |
| 4,866,497 | 9/1989 | Kosonocky | 257/222 |
| 5,003,565 | 3/1991 | Yoshida | 257/233 |

FOREIGN PATENT DOCUMENTS 486075  3/1992  Japan .

*Primary Examiner*—Gene M. Munson
*Attorney, Agent, or Firm*—Whitham, Curtis, Whitham & McGinn

[57] ABSTRACT

Photo-sensing elements are arranged in a form of a matrix, with photo-sensing characteristics substantially equal with each other in a row direction, but different therebetween in a column direction. Vertical charge transfer circuits receive charge signals in parallel from the photo-sensing elements, and transfer them as serial data therealong, respectively, to a horizontal CCD, which receives respective lowermost signals of the serial data from the vertical charge transfer circuits and transfers them as a serial data therealong, in which associated signals are substantially free of siginificant irregularities therebetween, so that the horizontal charge transfer circuit has an improved apparent charge transfer efficiency and an optimized drive amplitude, in addition to that a signal amplification in a data processor may be achieved with an optimized gain.

7 Claims, 6 Drawing Sheets

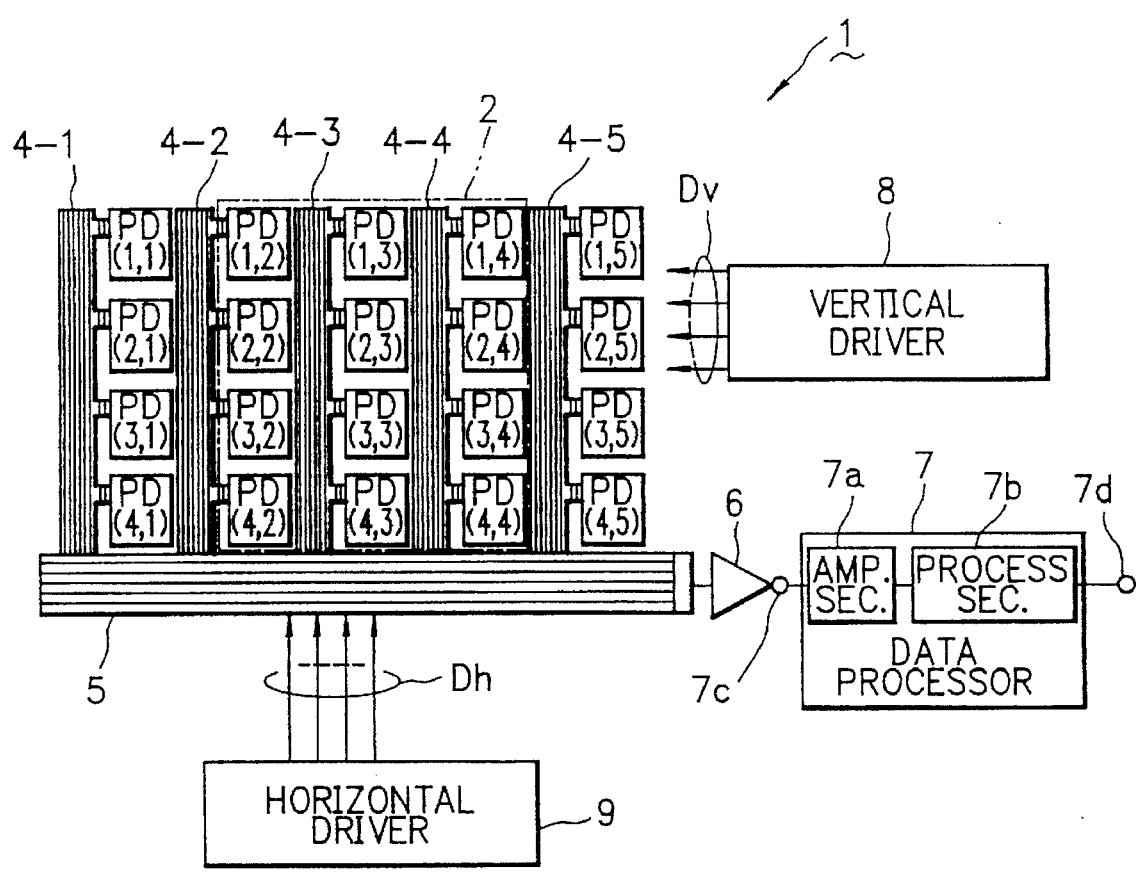

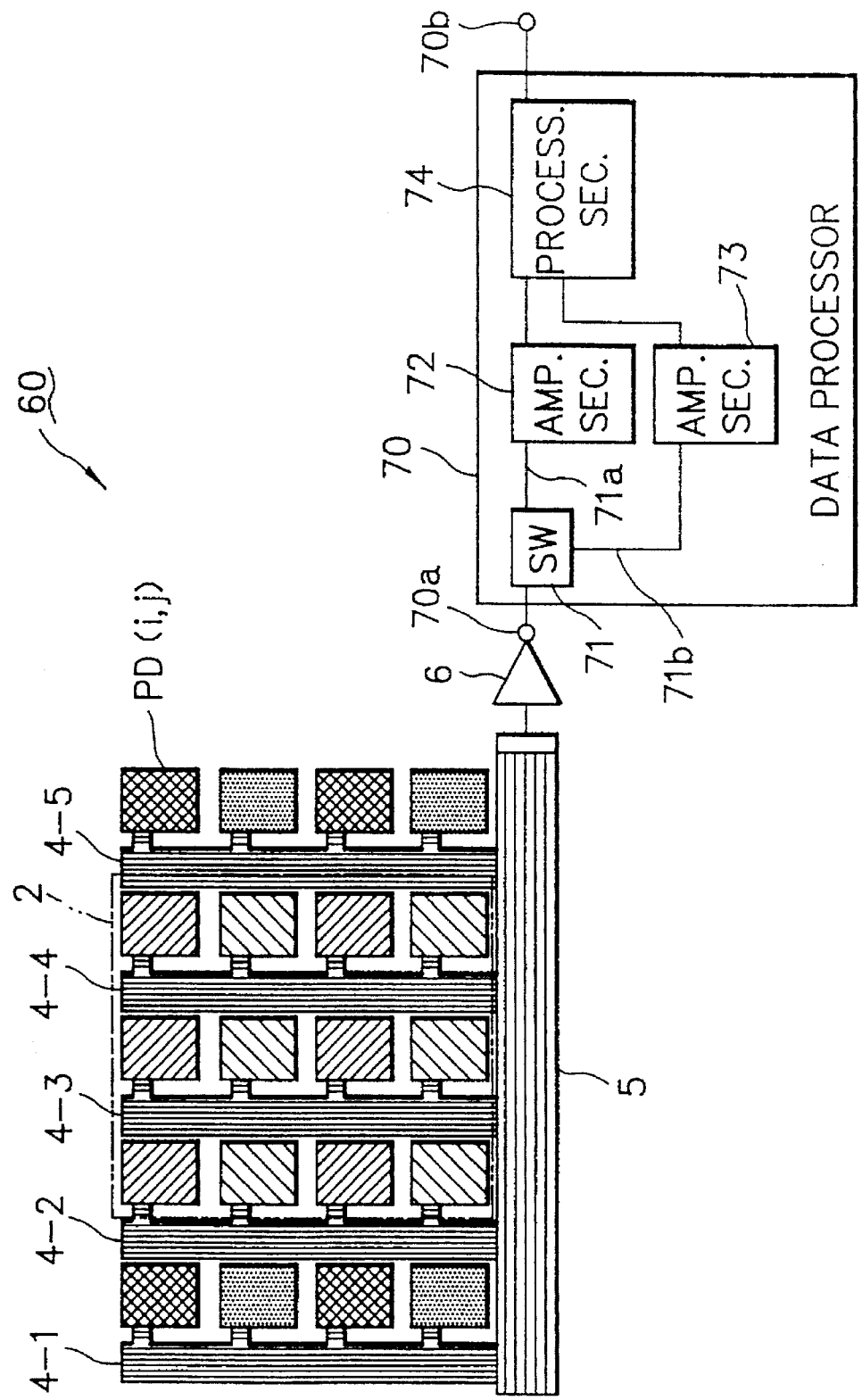

IMAGE PICKUP DEVICE WITH AND IMAGE PICKUP METHOD BY USE OF TWO-DIMENSIONALLY ARRANGED SENSORS HAVING SENSITIVITIES DIFFERENT IN CERTAIN DIRECTION OF ARRANGEMENT

BACKGROUND OF THE INVENTION

The present invention relates to an image pickup device and an image pickup method, and in particular, to an image pickup device of a solid state type with and an image pickup method by use of a solid-stated set of two-dimensionally arranged photo-sensing elements having sensitivities thereof different therebetween in a certain direction of the arrangement.

DESCRIPTION OF THE RELATED ART

There are known image pickup devices of the solid state type described above. For example, the Japanese Patent Application Laid-Open Publication No. 4-86075, 1992, has disclosed a conventional solid-stated infrared image pickup device including a set of photo-sensing elements each composed of an infrared image sensor using a Schottky effect.

FIG. 1 illustrates an essential part of the conventional infrared image pickup device in a visually accented manner. FIGS. 2A and 2B are time charts of associated signals, respectively.

In FIG. 1, designated at character 101 is the infrared image pickup device. The device 101 comprises a plurality of (twelve in the figure) infrared image sensors 103a, 103b and 103c two-dimensionally arranged in a rectangular form of a 4×8 matrix within an effective image area 102, a number of (three in the figure) vertical charge transfer circuits 104a, 104b and 104c for vertically shifting electric charges as signals, a horizontal charge transfer circuit 105 for horizontally shifting electric charges as signals, an output amplifier 106, and a data processor 107. The device 101 includes an unshown vertical driver for driving the vertical transfer circuits 104a, 104b and 104c, and an unshown horizontal driver for driving the horizontal transfer circuit 105.

Among the twelve image sensors 103a, 103b and 103c, leftmost four 103a arranged in a first column of the 4×3 matrix are all connected to a leftmost one 104a of the three vertical transfer circuits; intermediate four 103b in a second column, all to an intermediate one 104b; and rightmost four 103c in a third column, all to a rightmost one 104c. The intermediate sensors 103b each have a relatively high sensitivity to infrared rays of light incident thereto, while the leftmost and rightmost sensors 103a and 103c each have a relatively low sensitivity. In other words, the sensors, which are arranged in the rectangular matrix form, have the sensitivities different therebetween in a row direction of the arrangement. Each image sensor comprises a photo-diode with both a photo-electric conversion function and a signal charge storage function.

Each vertical transfer circuit 104a, 104b or 104c comprises a charge coupled device (hereafter CCD), and is called "vertical CCD", while in some cases the circuit may comprise a charge swept device (hereafter CSD).

Each vertical CCD 104a, 104b or 104c receives four parallel signals from the four sensors 103a, 103b or 103c connected thereto, respectively, and shifts them down as a serial data consisting of a vertical sequence of signals in terms of a quantity of charges, into the horizontal transfer circuit 105, in synchronism with a sequence of drive pulses in an unshown vertical drive signal supplied from the vertical driver.

The horizontal transfer circuit 105 also comprises a CCD, and is called "horizontal CCD". The horizontal CCD 105 receives a lowermost signal of the serial data from each of the three vertical CCD's 103a, 103b and 103c, i.e., it receives three parallel signals 130a, 130b and 130c (FIG. 2B) in terms of a quantity of charges in an associated packet (FIG. 2B), respectively.

Then, in synchronism with a sequence of (three) drive pulses 120a, 120b and 120c in a drive signal 120 supplied from the horizontal driver during a drive period before or after a blanking period B10 in a repeating field f10 in a predetermined frame of time, the received signals are rightwardly shifted in the horizontal CCD 105, as a serial data 130 consisting of a horizontal sequence of signals, i.e. the quantities of charges 130c, 130b and 130a in a sequence of packets having corresponding potentials developed, to the output amplifier 106, where each signal is amplified to be output as a potential signal to the data processor 107. The drive pulses 120a, 120b and 120c have an even amplitude A10 in each frame.

The data processor 107 comprises an amplifier section 107a and a processor section 107b. The serial data output from the horizontal CCD 105 and amplified by the output amplifier 106 is input via an input terminal 107c of the processor 107 to the amplifier section 107a, where each potential signal is multiplied by an amplification factor to be output as a level signal to the processor section 107b, where it is processed as necessary, so that a desirable datastream is output via an output terminal 107d of the processor 107. The datastream represents an array of image data, as they are picked up by a row of sensors 103a–103b–103c and read in order from the rightmost column to the leftmost column.

Like processing at the processor 107 is repeated for each serial data from the horizontal CCD 105, i.e., for each field f10 in a frame or for each row of the matrix, from a lowermost row to an uppermost row, or four times in total in the frame, whereby the twelve sensors are all scanned, when a certain scan cycle ends and a subsequent scan cycle starts.

As a result, a set of spatially distributed image data within the effective image area 102 is transduced every scan cycle into a temporal sequence of data, through the image pickup device 101 which may be one of a great number of image pickup units that constitute an image pickup system.

In the conventional image pickup device 101, the image sensors 108a, 108b and 108c in each row of the rectangular matrix have the sensitivities relatively low, high and low, respectively, so that the sensitivities are different therebetween in the row direction, as described. Another conventional image pickup device may have a set of image sensors arranged in a rectangular form of a matrix including a row deformed, e.g. checkerwise, providing that those sensors arranged in the deformed row still have sensitivities thereof different therebetween in a row direction of the matrix.

In either case, a plurality of image sensors having different sensitivities therebetween are arranged in a certain geometrical direction (e.g. horizontal direction) in which they have to be connected in a one-to-one corresponding manner to a plurality of first CCD's (e.g. vertical CCD's) that are connected in parallel with each other to a single second CCD (e.g. horizontal CCD).

The second CCD is thus required to shift a sequence of charges as signals received from the first CCD's, at a transfer speed higher enough, than that in each first CCD, to have a charge transfer therealong completed, before entering a reception of a subsequent sequence of charges as signals from the second CCD's.

However, in each sequence of signals in the second CCD, the respective signals have their quantities of charges subjected to corresponding ones of the sensor sensitivities that are different between the image sensors in the certain geometrical direction, so that the quantities of charges are also different therebetween in dependence on the corresponding sensor sensitivities, in addition to related factors to be taken into consideration.

Namely, on the one hand, a typical image pickup device for detecting a set of image data with effective color information such as on a chrominance or infrared data on a real temperature or thermal radition of a target is needed to have a set of image sensors arranged within an effective image area, with sensitivities thereof significantly different therebetween, or in other words, with a significant difference between picked data.

Accordingly, in a typical case, it is desirable for the signals in the second CCD to have quantities of charges representative of a significant difference between image data picked up by associated sensors.

On this respect, in an infrared image pickup device employing a Schottky diode as a sensing element, each image data sensed by the element includes a background current component variable with a remarkable dependency on a sensitivity of the element, so that a typical case may be bound to a remarkable difference. in level or charge quantity between a pair of adjacent packets in a field of time, like FIG. 2B.

On the other hand, in general, the CCD is evaluated by a charge transfer efficiency thereof in terms of a ratio of a quantity of output charges at an end part of the CCD to that of input charges at a particular intermediate part thereof.

However, a given CCD that has an inherent charge transfer efficiency (hereafter "inherent efficiency") associated therewith exhibits an apparent charge transfer efficiency (hereafter "apparent efficiency") which is variable in accordance with a variety of applications of the CCD. In an application to an image pickup device, the apparent efficiency acts as a controlling factor to a resultion of a displayed image on an associated screen.

The inherent efficiency is determined, under an ideal condition, between a quantity of input charges, as they are filled to a packetful level in a particular packet among a sequence of vacant packets in the CCD (subject to a very small amount of bias charges to be precharged in each packet in a fat zero case), and a quantity of output charges, as they are effectively available from an end packet among the sequence of packets in the CCD, while some of the input charges tend to be lost or left in the way of transfer from the particular packet to the end packet.

On the contrary, the apparent efficiency usually is determined under a practical condition, where a number of signals substantially of an even level (i.e. with an even charge quantity) may be sequentially transferred, substantially without interruptions, so that each of them may have a certain fraction of the charge quantity thereof left off, which fraction however is supplemented by a corresponding left-off fraction from a preceding signal, thus seemingly resulting in a reduced transfer loss.

Accordingly, in a typical use as the second CCD in either of the conventional cases described, the CCD tends to exhibit an apparent efficiency higher than an inherent efficiency thereof, so that, if a desirable condition be met, it may work with a favorable apparent efficiency even at a temperature level as low as 80° K., where the charge transfer efficiency otherwise might be bound to an extremely low value due such as to a freezed out dopant in the CCD.

However, in the conventional cases described, the image sensors are arranged so as to have different sensitivities in a row direction. Such the sensor arrangement tends to produce a number of irregular signals in parallel, which will constitute a sequence of signals with significant irregularities in level in the second CCD, as they are directly input therein. Thus, a resultant apparent efficiency tends to be held smaller than the CCD otherwise could achieve.

Further, the charge transfer efficiency of a CCD generally depends on an amplitude of an associated drive pulse, too. An increased amplitude develops an electric field with an enlarged fringe contributing to an improved efficiency, while giving rise to problems such as an increased heat generation in a solid-state device due to an increased dissipation of drive power. In practical use of a CCD, therefore, the drive pulse amplitude is controlled at an optimal value for a designed signal level, or at a selected one of optimal values for a predicted one of signal levels.

In the conventional cases, however, the second CCD tends to receive a number of signals with significant irregularities as described, and hence has to be driven with a pulse amplitude determined first of all to effectively cover a probable range of such irregularities, thus suffering from a difficulty of achieving an optimized driving, resulting in a relatively small charge transfer efficiency and a suppressed limitation to an integration of a solid-state device.

Still less, in the conventional device illustrated in FIG. 1, the amplifier section 107a of the data processor 107 is responsible to amplify each input signal from the output amplifier 106, with an appropriate gain that is close related to a sensitivity characteristic of an image sensor associated with the signal. For an optimal amplilification, the gain is needed to be varied in accordance with a unique performance of an associated sensor or a common performance to some sensors, in synchronizm with a separation of a serial input data into repective signals. In the state of art, however, it is difficult for the data processor 107 to effectively achieve such a rapid separation. There may thus be achieved an insufficient optimization in gain control.

SUMMARY OF THE INVENTION

The present invention has been achieved with such points in mind.

It is therefore an object of the present invention to provide an image pickup device of a solid state type with and an image pickup method by use of a solid-stated set of two-dimensionally arranged photo-sensing elements having sensitivities thereof different therebetween in a certain direction of the arrangement, which permits a number of vertical charge transfer circuits connected to the photo-sensing elements to output a number of parallel signals substantially free of significant irregularities, so that a horizontal charge transfer circuit connected to the vertical charge transfer circuits may serially transefer the signals with an improved apparent efficiency and an optimized drive amplitude, in addition to that a signal amplification in a data processor may be achieved with an optimized gain.

To achieve the object, a genus of the present invention provides an image pickup device of a solid state type comprising at least one combination of four photo-sensing elements that may be image sensors, and at least one combination of three charge transfer circuits that may be CCD's.

More specifically, the image pickup device comprises a first photo-sensing element that has a first photo-sensing characteristic for sensing a first flux of light to generate a first charge signal consisting of a first quantity of charges, a second photo-sensing element that has a second photo-sensing characteristic for sensing a second flux of light, which is substantially equivalent the first flux of light, to generate a second charge signal consisting of a second quantity of charges, which is different from the first quantity of charges, a third photo-sensing element that has a third photo-sensing characteristic for sensing a third flux of light, which is substantially equivalent to the first flux of light, to generate a third charge signal consisting of a third quantity of charges, which is substantially equivalent to the first quantity of charges, a fourth photo-sensing element that has a fourth photo-sensing characteristic for sensing a fourth flux of light, which is substantially equivalent to the first flux of light, to generate a fourth charge signal consisting of a fourth quantity of charges, which is substantially equivalent to the second quantity of charges, a first charge transfer circuit that receives the first and second charge signals in parallel from the first and second photo-sensing elements, as a first data, and serially transfers therealong the first data so that the first charge signal follows the second charge signal, a second charge transfer circuit that receives the third and fourth charge signals in parallel from the third and fourth photo-sensing elements, as a second data, and serially transfers therealong the second data so that the third charge signal follows the fourth charge signal, and a third charge transfer circuit that first receives the second charge signal in the first data and the fourth charge signal in the second data in parallel from the first and second charge transfer circuits, as a third data, and serially transfers therealong the third data so that the fourth charge signal follows the second charge signal, and thereafter receives the first charge signal in the first data and the third charge signal in the second data in parallel from the first and second charge transfer circuits, as a fourth data, and serially transfers therealong the fourth data so that the third charge signal follows the first charge signal.

According to the genus of the invention, the first and third signals are substantially free of siginificant irregularities therebetween, as well as the second and fourth signals. The first and second charge transfer circuits may comprise a pair of vertical CCB's, and the third charge transfer circuit may comprise a horizontal CCD. Thus, the genus permits a number of vertical charge transfer circuits connected to the photo-sensing elements to output a number of parallel signals substantially free of significant irregularities, so that a horizontal charge transfer circuit connected to the vertical charge transfer circuits may serially transefer the signals with an improved apparent efficiency and an optimized drive amplitude, in addition to that a signal amplification in a data processor may be achieved with an optimized gain.

According to the genus of the invention, in the image pickup device, which is of a solid-state type, the first and second photo-sensing elements should have connections to the first charge transfer circuit so as to permit this circuit to receive the first and second signals from those elements in parallel, as the first data subjected to a described data flow. Concurrently, the third and fourth photo-sensing elements should have connections to the second charge transfer circuit so as to permit this circuit to receive the third and fourth signals from those elements in parallel, as the second data subjected to a described data flow. To have both requirements met, the four photo-sensing elements may preferably be arranged in a rectangular form of a 2×2 matrix with a first row having the third and first elements and a second row having the fourth and second elements and with a first column having the third and fourth elements and a second column having the first and second elements. In that case, those elements arranged in the first row each have a photo-sensing characteristic equal to or substantially equivalent to the first photo-sensing characteristic, and those in the second row each have a photo-sensing characteristic equal to or substantially equivalent to the second photo-sensing characteristic. Moreover, those elements arranged in the first column have the third and fourth photo-sensing characteristics different from each other, and those in the second column have the first and second photo-sensing characteristics different from each other. In other words, the four photo-sensing elements have their photo-sensing characteristics different therebetween in a column direction.

According to a species of the genus of the invention, the image pickup device further comprises an output amplifier that serially receives the third and fourth data from the third charge transfer circuit, as fifth and sixth data, respectively, and converts on the one hand the fifth data into a first signal sequence consisting of a first potential signal, which is representative of the second charge signal in the fifth data, and a second potential signal, which is representative of the fourth charge signal in the fifth data, such that the second potential signal follows the first potential signal, and on the other hand the sixth data into a second signal sequence consisting of a third potential signal, which is representative of the first charge signal in the sixth data, and a fourth potential signal, which is representative of the third charge signal in the sixth data, such that the fourth potential signal follows the third potential signal.

According to an individual of the species of the invention, the image pickup device further comprises an amplifying means for amplifying the first signal sequence with a first gain controlled in accordance with the first photo-sensing characteristic to obtain a first amplified signal sequence, and the second signal sequence with a second gain controlled in accordance with the second photo-sensing characteristic to obtain a second amplified signal sequence, and a processing means for processing the first and second amplified signal sequences to obtain a datastream.

According to another species of the genus of the invention, the image pickup device further comprises a first drive circuit for generating a first pulse signal to thereby drive the first and second charge transfer circuits, and a second drive circuit for generating a second pulse signal to thereby drive the third charge transfer circuit.

According to an individual of this species of the invention, the second pulse signal comprises a sequence of drive pulses, and the second drive circuit changes a pulse amplitude of the sequence of drive pulses between a first amplitude for driving the third charge transfer circuit to transfer the third data, such that the first amplitude depends on the second photo-sensing characteristic, and a second amplitude for driving the third charge transfer circuit to transfer the fourth data, such that the second amplitude depends on the first photo-sensing characteristic.

Moreover, to achieve the object described, another genus of the invention provides a generalized subject matter in which an image pickup device of a solid-state type comprises M×N photo-sensing elements two-dimensionally arranged in a form of a matrix with M rows and N columns so that an i-th row of the M rows has N elements of the M×N elements and a j-th column of the N columns has M elements of the M×N elements, respectively, where M and N are predetermined integers larger than unity, respectively, and i and j are arbitrary integers such that $1 \leq i \leq N$ and $1 \leq j \leq M$, respectively, the N elements of the i-th row having an i-th photo-sensing characteristic for sensing an i-th flux of light to generate an i-th charge signal consisting of an i-th quantity of charges, the N elements of an (i+1)-th row of the M rows having an (i+1)-th photo-sensing characteristic for sensing an (i+1)-th flux of light substantially equivalent to the i-th flux of light to generate an (i+1)-th charge signal consisting of an (i+1)-th quantity of charges different from the i-th quantity of charges, N first charge transfer circuits connected to the M×N elements such that a j-th first circuit of the N first charge transfer circuits is connected to the M elements of the j-th column, for receiving therefrom the i-th and (i+1)-th charge signals in parallel as a j-th data and for serially transferring the j-th data along the j-th first circuit so that the i-th charge signal follows the (i+1)-th charge signal, and a (j+1)-th first circuit of the N first charge transfer circuits is connected to the M elements of a (j+1)-th column of the N columns, for receiving therefrom the i-th and (i+1)-th charge signals in parallel as a (j+1)-th data and for serially transferring the (j+1)-th data along the (j+1)-th first circuit so that the i-th charge signal follows the (i+1)-th charge signal, and a second charge transfer circuit connected to the N first charge transfer circuits, for receiving therefrom the (i+1)-th charge signals in the j-th and (j+1)-th data in parallel as an (M-i)-th data and serially transferring the (M-i)-th data along the second circuit so that the (i+1)-th charge signal from the j-th data follows the (i+1)-th charge signal from the (j+1)-th data, and for receiving therefrom the i-th charge signals in the j-th and (j+1)-th data in parallel as an (M-i+1)-th data and serially transferring the (M-i+1)-th data along the second circuit so that the i-th charge signal from the j-th data follows the i-th charge signal from the (j+1)-th data.

Further, to achieve the object described, still another genus of the invention provides an image pickup method by use of a solid-stated set of photo-sensing elements including a first photo-sensing element that has a first photo-sensing characteristic for sensing a first flux of light to generate a first charge signal consisting of a first quantity of charges, a second photo-sensing element that has a second photo-sensing characteristic for sensing a second flux of light substantially equivalent to the first flux of light to generate a second charge signal consisting of a second quantity of charges different from the first quantity of charges, a third photo-sensing element that has a third photo-sensing characteristic for sensing a third flux of light substantially equivalent to the first flux of light to generate a third charge signal consisting of a third quantity of charges substantially equivalent to the first quantity of charges, and a fourth photo-sensing element that has a fourth photo-sensing characteristic for sensing a fourth flux of light substantially equivalent to the first flux of light to generate a fourth charge signal consisting of a fourth quantity of charges substantially equivalent to the second quantity of charges.

The image pickup method comprises the steps of: receiving by a first charge transfer circuit the first and second charge signals in parallel from the first and second photo-sensing elements, as a first data; serially transferring the first data along the first charge transfer circuit so that the first charge signal follows the second charge signal; receiving by a second charge transfer circuit the third and fourth charge signals in parallel from the third and fourth photo-sensing elements, as a second data; serially transferring the second data along the second charge transfer circuit so that the third charge signal follows the fourth charge signal: receiving by a third charge transfer circuit the second charge signal in the first data and the fourth charge signal in the second data in parallel from the first and second charge transfer circuits, as a third data; serially transferring the third data along the third charge transfer circuit so that the fourth charge signal follows the second charge signal; receiving by the third charge transfer circuit the first charge signal in the first data and the third charge signal in the second data in parallel from the first and second charge transfer circuits, as a fourth data; and serially transferring the fourth data along the third charge transfer circuit so that the third charge signal follows the first charge signal.

BRIEF DESCRIPTION OF THE DRAWINGS

The objects, features and advantages of the present invention will become more apparent from consideration of the following detailed description, taken in conjunction with the accompanying drawings, in which:

FIG. 3 is a block diagram of an infrared image pickup device according to an embodiment of the invention;

FIG. 7 is a block diagram of an infrared image pickup device according to a modification of the embodiment illustrated in FIG. 3.

DESCRIPTION OF THE PREFERRED EMBODIMENTS

There will be detailed below preferred embodiments of the present invention, with reference to FIGS. 8 to 7.

Throughout the Figures, like members or parts are designated at like characters. "Vertical" means a perpendicular direction to a reference plane that may be the ground, and "horizontal" means a parallel direction to the reference plane.

Figure 5A:
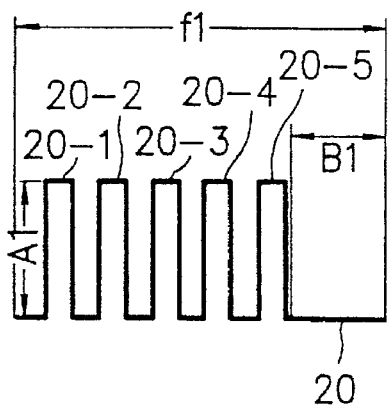
FIGS. 5A and 5B as well as FIGS. 6A and 6B are time charts of signals associated with the image pickup device of FIG. 3, respectively.
Figure 6A:
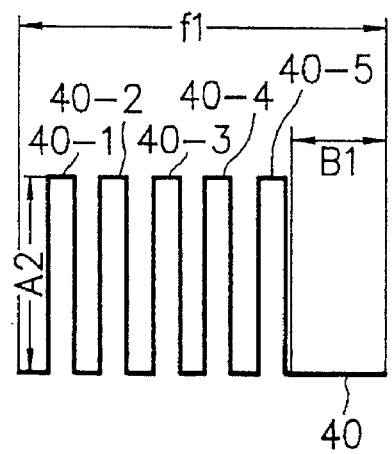
Figure 5B:
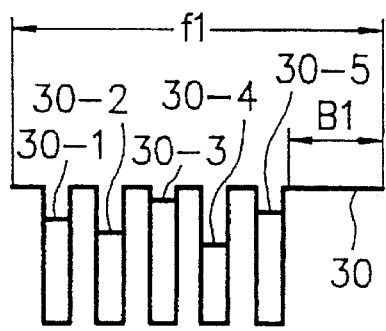
Figure 6B:
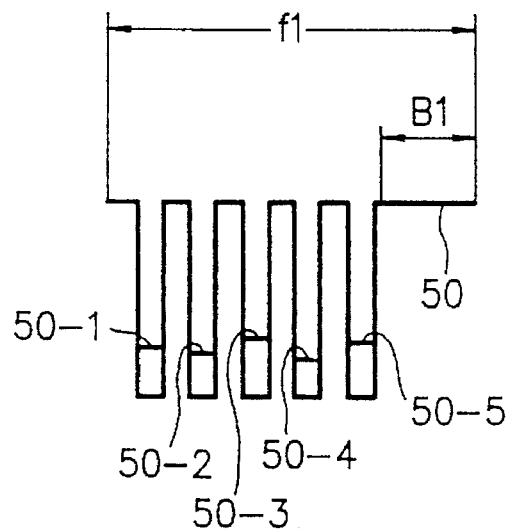

FIG. 3 shows an infrared image pickup device according to an embodiment of the invention. FIGS. 5A and 5B as well as FIGS. 6A and 6B show signals associated with the device of FIG. 3, respectively.

In FIG. 3, designated at character 1 is the infrared image pickup device. The device 1 comprises a plurality of (twenty in the figure) infrared image sensors as photo-sensing diode elements, hereafter PD(i, j), where i and j are arbitrary integers such that $1 \leq i \leq 4$ and $1 \leq j \leq 5$, respectively. The elements PD(i, j) are two-dimensionally arranged in a rectangular form of a 4×5 matrix, including a 4×3 matrix within an effective image area 2, where a flux of light (infrared rays) is incident through a very small square window overlapping the effective image area.

The square window is opened in an unshown mask member covering an apparent image area of an image pickup system that consists of a great number of infrared image pickup devices including the shown device 1.

The diode elements PD(i, j) have their photosensing characteristics different therebetween in a column direction.

Namely, among the diode elements PD(i, j), those PD(1, j) arranged in a first row of the 4×5 matrix and those PD(3, j) arranged in a third row each comprise a platinum silicide Schottky diode adapted for a cutoff wavelength of 5 μm, and those PD(2, j) arranged in a second row and those PD(4, j)

arranged in a fourth row each comprise a platinum silicide Schottky diode adapted for a reduced cutoff wavelength of 4 μm by applying an ion injection of an n-type dopant to a boundary face or interface of the diode. The elements PD(1, j) and PD(8, j) are each designed with a photo-sensing characteristic (hereafter "characteristic A") that outputs a charge signal equivalent to a voltage between a minimum level of 500 mV for a room temperature radiation and a maximum level of 1000 mV for a black body radiation, subject to a measurement range from a room temperature to a 100° C. at an object as a target of the device 1. The elements PD(2, j) and PD(4, j) are each designed with another photo-sensing characteristic (hereafter "characteristic B") that outputs a charge signal equivalent to a voltage between a minimum level of 200 mV for the room temperature radiation and a maximum level of 500 mV for the black body radiation, under the same condition as PD(1, j) and PD(3, j). Each element PD(i, j) has both a photo-electric conversion function and a signal charge storage function.

The device 1 thus comprises at least one combination of four photo-sensing elements PD(3, 3), PD(3, 4), PD(4, 3) and PD(4, 4). More specifically, the device 1 comprises a first photo-sensing element PD(3, 4) that has a first photo-sensing characteristic, i.e. the characteristic A, for sensing a first flux of light to generate a first charge signal consisting of a first quantity of charges, a second photo-sensing element PD(4, 4) that has a second photo-sensing characteristic, i.e. the characteristic B, for sensing a second flux of light substantially equivalent to the first flux of light to generate a second charge signal consisting of a second quantity of charges different from the first quantity of charges, a third photo-sensing element PD(3, 3) that has a third photo-sensing characteristic, i.e. the characteristic A, for sensing a third flux of light substantially equivalent to the first flux of light to generate a third charge signal consisting of a third quantity of charges substantially equivalent to the first quantity of charges, and a fourth photo-sensing element PD(4, 8) that has a fourth photo-sensing characteristic, i.e. the characteristic B, for sensing a fourth flux of light substantially equivalent to the first flux of light to generate a fourth charge signal consisting of a fourth quantity of charges substantially equivalent to the second quantity of charges.

The device 1 further comprises a number of (five in the figure) vertical charge transfer circuits 4-j for vertically shifting electric charges as signals, a horizontal charge transfer circuit 5 for horizontally shifting electric charges as signals, an output amplifier 6, and a data processor 7, as well as a vertical driver 8 for driving the vertical transfer circuits 4-j and a horizontal driver 9 for driving the horizontal transfer circuit 5.

Among the twenty image sensors PD(i, j), leftmost four PD(i, 1) arranged in a first column of the 4×5 matrix are all connected to a leftmost one 4-1 of the five vertical transfer circuits 4-j; intermediate four PD(i, 2), PD(i, 3) or PD(i, 4) in a second, third or fourth column, all to an intermediate one 4-2, 4-3 or 4-4; and rightmost four PD(i, 5) in a fifth column, all to a rightmost one 4-5.

Each vertical transfer circuit 4-j comprises a charge coupled device CCD, and is at times called "vertical CCD". The circuit 4-j may comprise a charge swept device CSD.

Each vertical CCD receives four parallel signals from the four elements connected thereto, respectively, and shifts them down as a serial data consisting of a vertical sequence of signals in terms of a quantity of charges, into the horizontal transfer circuit 5, in synchronism with a sequence of drive pulses in a vertical drive signal Dv supplied from the vertical driver 8.

The horizontal transfer circuit 5 also comprises a CCD, and is at times called "horizontal CCD". The horizontal CCD 5 receives a lowermost signal of the serial data from each of the five vertical CCD's 4-j, i.e., it receives five parallel signals 30-j (FIG. 5B) or 50-j (FIG. 6B) in terms of a quantity of charges, respectively. The signals 30-j are each transfered from a diode element PD(i, j) of the characteristic A through an associated vertical CCD 4-j, and the signals 50-j are each transfered from a diode element PD(i, j) of the characteristic B through an associated vertical CCD 4-j.

Then, in synchronism with a sequence of five drive pulses 20-j (FIG. 5A) for the signals 30-j or five drive pulses 40-j (FIG. 6A) for the signals 50-j, in a drive signal Dh supplied from the horizontal driver 9 during a drive period before or after a blanking period B1 in a repeating field f1 in a predetermined frame of time, the received signals 30-j or 50-j are rightwardly shifted in the horizontal CCD 5, as a serial data 30 or 50 consisting of a horizontal sequence of signals, i.e. the quantities of charges 30-j or 50-j having corresponding potentials developed, to the output amplifier 6, where each signal is amplified to be output as a potential signal to the data processor 7. The drive pulses 20-j or 40-j have an even amplitude A1 or A2, respectively, in each frame.

Charge signals from elements of the characteristic A each has a relatively high level, but those from elements of the characteristic B each has a relatively low level. The amplitude A1 is optimized in consideration of the characteristic A of associated elements PD(1, j) or PD(3, j), and the amplitude A2 is optimized in consideration of the characteristic B of associated elements PD(2, j) or PD(4, j). The amplitude A1 is controlled to be relatively small, to minimize power dissipation, while keeping a favorable apparent efficiency. The amplitude A2 however is controlled to be relatively large to keep the apparent efficiency within a permissible range. The amplitude A1 may be changed between elements PD(1, j) and PD(3, j) for an adaptive control, and the amplitude A2 may also be changed between elements PD(2, j) and PD(4, j).

For example, in an application to an NTSC standard television system, an associated image pickup system may have three hundred and twenty thousands sensing elements or pixels, where a horizontal CCD handles data at a high rate pulse of 12 MHz, with a difficulty of synchronously changing the pulse amplitude.

According to the embodiment, however, a horizontal blanking period B1 is available for changing an amplitude of associated drive pulses, such as between A1 and A2.

If the horizontal blanking period B1 is short to cover a necessary period for stabilizing a waveform of a horizontal drive pulse, associated image data may have a reduced reliability in correspondence to a difference of time therebetween. To provide for such a situation, the number of sensing elements in a horizontal direction, i.e. the number of columns of matrix may be excessively set, with a number of extra elements that may effectively serve as a bias charge source.

The output amplifier 6 receives charge signals as a serial data from the horizontal CCD 5, and converts them into a signal sequence or serial data consisting of potential signals representative of the received charge signals.

The the data processor 7 comprises an amplifier section 7a and a processor section 7b. The serial data output from the horizontal CCD 5 and amplified by the output amplifier 6 is input via an input terminal 7c of the processor 7 to the amplifier section 7a, where each potential signal is multiplied by an amplification factor, to be output as a level signal to the processor section 7b, where it is processed as necessary, so that a desirable datastream is output via an output terminal 7d of the processor 107. The amplification factor of the amplifier section 7a is optimized in accordance with the characteristic A or B of associated sensing elements PD(i, j). The datastream represents an array of image data, as they are picked up by the elements PD(i, j) and read in order from the rightmost column 4-5 to the leftmost column 4-1.

Like processing at the processor 107 is repeated for each serial data from the horizontal CCD 5, i.e., for each field f1 in a frame or for each row of the 4×5 matrix, from a lowermost row to an uppermost row, or four times in total in the frame, whereby the twenty sensors are all scanned, when a certain scan cycle ends and a subsequent scan cycle starts.

The diode elements PD(i, 1) and PD(i, 5) in both end columns are dummy elements provided to minimize an intermission of charge transfer along the horizontal CCD 5 between adjacent fields f1 of time, to thereby increase the apparent efficiency of the CCD 5.

As a result, a set of spatially distributed image data within the effective image area 2 is transduced every scan cycle into a temporal sequence of data, through the image pickup device 1.

Data on the characteristics A and e may be stored in or read by the data processor 7, the vertical driver 8 and the horizontal driver 9.

The photo-sensing elements PD(i, j) may have different photo-sensing characteristics larger in number than two, so that those in every n-th row may all have an even characteristic when the number of different chacracteristics is n.

In the present embodiment, each sensing element PD(i, j) may preferably comprise a visible ray sensor, to thereby constitute a visible ray image pickup device with an on-chip filter.

In a generic expression, in which the number of rows, i.e. 4, is replaced by an integer M and the number of columns, i.e. 5, is replaced by an integer N, the device 1 may thus comprise M×N photo-sensing elements PD(i, j), N first charge transfer circuits 4-j and a second charge transfer circuit 5.

The M×N photo-sensing elements PD(i, j) are two-dimensionally arranged in a form of a matrix with M rows and N columns so that an i-th row of the M rows has N elements of the M×N elements and a j-th column of the N columns has M elements of the M×N elements, respectively, where M and N are predetermined integers larger than unity, respectively, and i and j are arbitrary integers such that $1 \leq i \leq N$ and $1 \leq j \leq M$, respectively. The N elements of the i-th row have an i-th photo-sensing characteristic A for sensing an i-th flux of light to generate an i-th charge signal consisting of an i-th quantity of charges. The N elements of an (i+1)-th row of the M rows have an (i+1)-th photo-sensing characteristic B for sensing an (i+1)-th flux of light substantially equivalent to the i-th flux of light to generate an (i+1)-th charge signal consisting of an (i+1)-th quantity of charges different from the i-th quantity of charges.

The N first charge transfer circuits 4-j are connected to the M×N elements such that a j-th first circuit of the N first charge transfer circuits is connected to the M elements of the j-th column, for receiving therefrom the i-th and (i+1)-th charge signals in parallel as a j-th data and for serially transferring the j-th data along the j-th first circuit so that the i-th charge signal follows the (i+1)-th charge signal, and a (j+1)-th first circuit of the N first charge transfer circuits is connected to the M elements of a (j+1)-th column of the N columns, for receiving therefrom the i-th and (i+1)-th charge signals in parallel as a (j+1)-th data and for serially transferring the (j+1)-th data along the (j+1)-th first circuit so that the i-th charge signal follows the (i+1)-th charge signal.

The second charge transfer circuit 5 is connected to the N first charge transfer circuits, for receiving therefrom the (i+1)-th charge signals in the j-th and (j+1)-th data in parallel as an (M-i)-th data and serially transferring the (M-i)-th data along the second circuit so that the (i+1)-th charge signal from the j-th data follows the (i+1)-th charge signal from the (j+1)-th data, and for receiving therefrom the i-th charge signals in the j-th and (j+1)-th data in parallel as an (M-i+1)-th data and serially transferring the (M-i+1)-th data along the second circuit so that the i-th charge signal from the j-th data follows the i-th charge signal from the (j+1)-th data.

Figure 1:
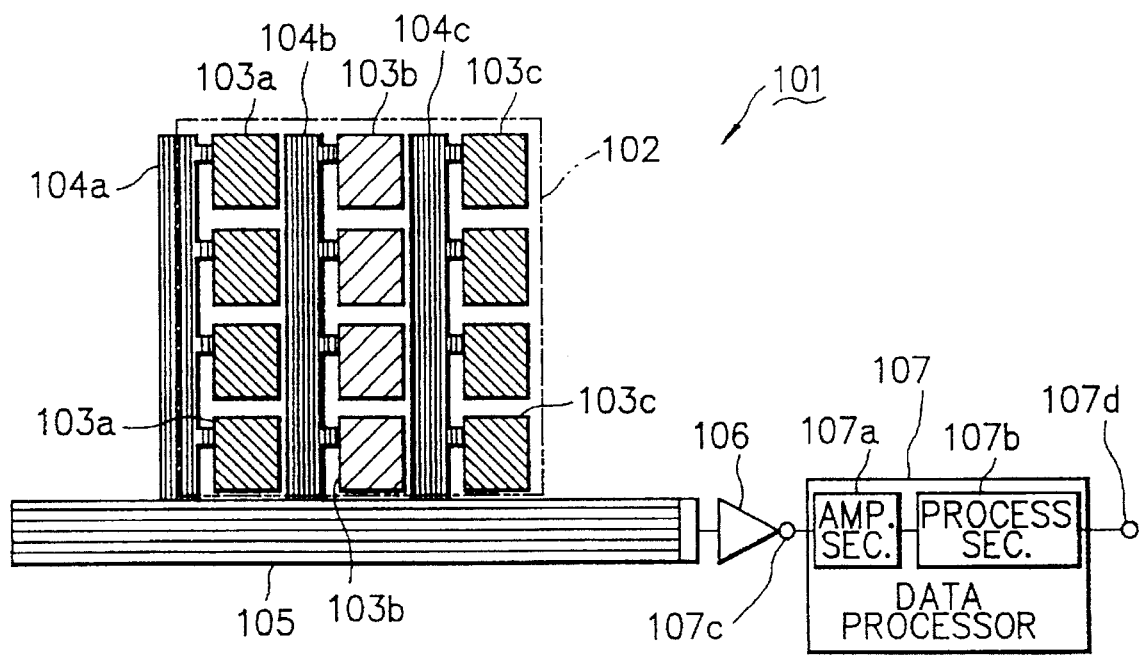
FIG. 1 is a block diagram of an essential part of a conventional infrared image pickup device.
Figure 2A:
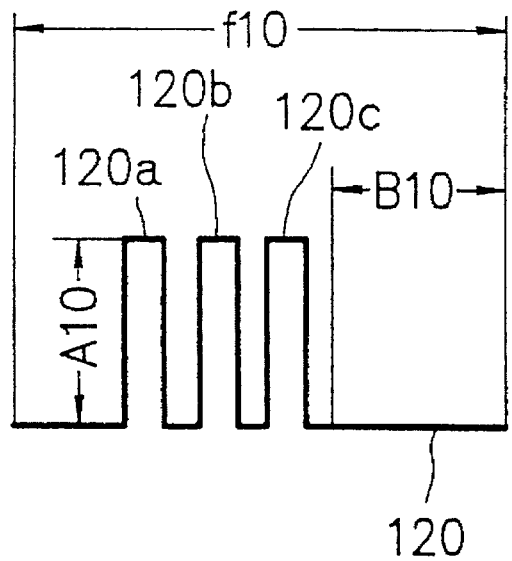
FIGS. 2A and 2B are time charts of signals associated with the conventional image pickup device of FIG. 1, respectively.
Figure 2B:
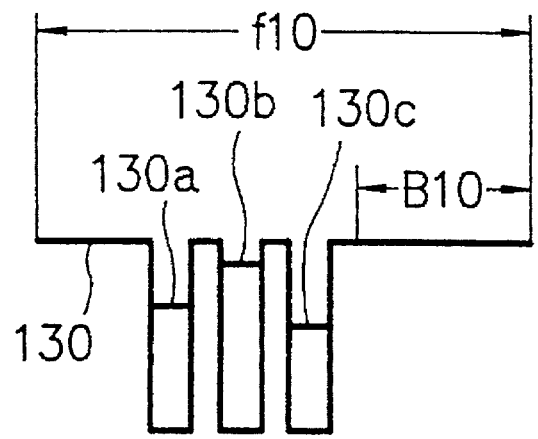
Figure 4:
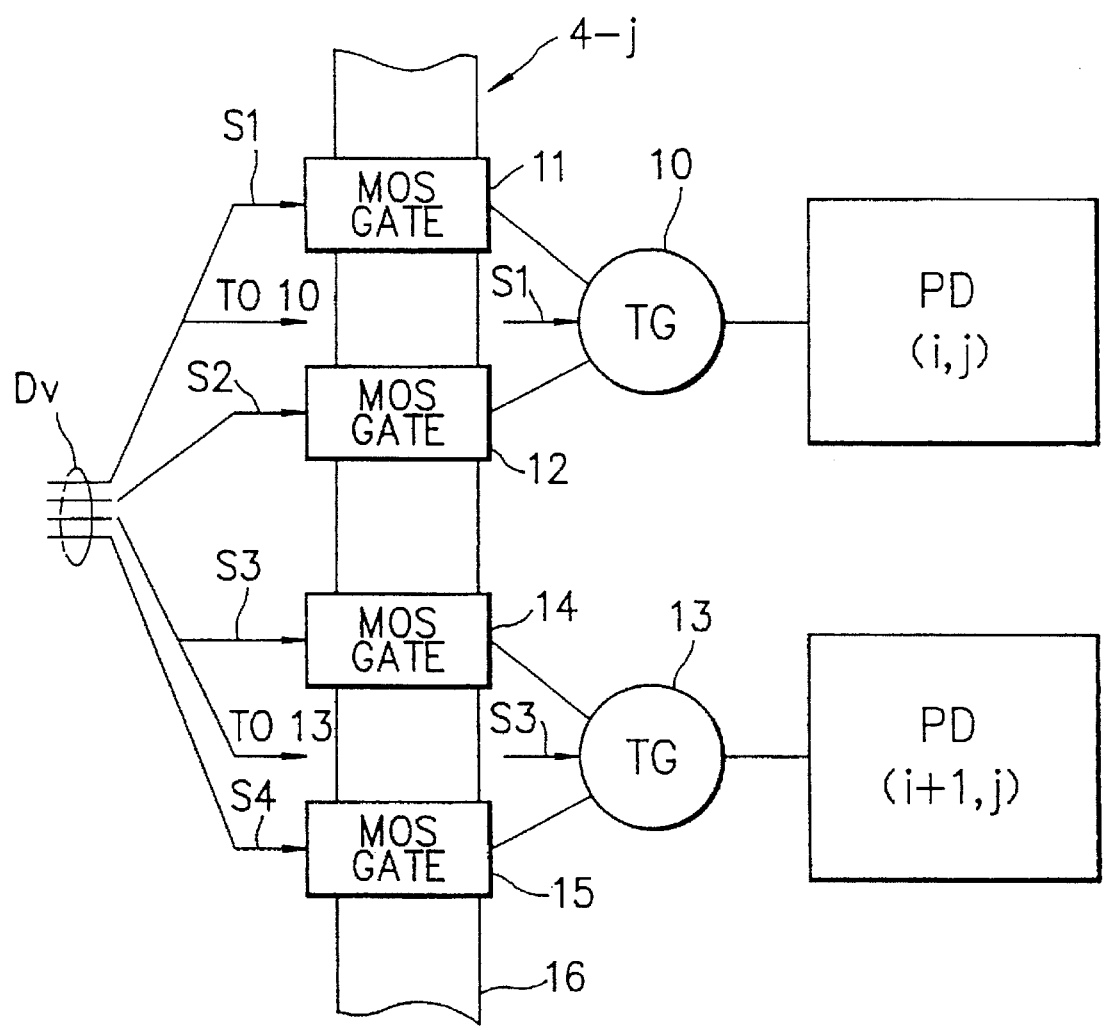
FIG. 4 is a block diagram of an essential part of the image pickup device of FIG. 3.

FIG. 4 shows an essential part of the image pickup device of FIG. 3.

Each vertical CCD 4-j comprises a plurality of MOS gate combinations each consisting of a pair of upper MOS gates 11, 12 each connected through an upper transfer gate 10 to an associated diode element PD(i, j) having the characteristic A and a pair of lower MOS gates 14, 15 each connected through a lower transfer gate 13 to an associated diode element PD(i+1, j) having the characteristic B, and a channel member 16 for connecting the respective MOS gates 11, 12, 14, 15 in series.

The vertical drive signal Dv comprises four three-valued level signals S1 to S4 for driving the respective gates 10 to 15 in an interlacing manner between a field for horizontal transfer of signals from elements of the characteristic A and another field for horizontal transfer of signals from elements of the characteristic B.

FIG. 7 shows an infrared image pickup device according to a modification of the embodiment described, in an accented manner by illustrating photo-sensing characteristics with shadow lines.

The image pickup device is designated at character 60. It has a data processor 70 including a select switch 71 for selecting, among a serial data from a horizontal CCD 5, a signal 71a from a photo-sensing element of the characteristic A to send it to a first amplifier 72, and a signal 71b from a photo-sensing element of the characteristic B to send it to a second amplifier 73. The data processor further comprises a processor section 74. Designated at 70a and 70b are input and output terminals of the processor 70, respectively.

The first amplifier 72 amplifies the signal 71a with an optimized gain in accordance with the characteristic A, to output an amplified signal within a desirable signal range. Likewise, the second amplifier 73 amplifies the signal 71b with an optimized gain in accordance with the characteristic B.

The characteristic B has an output range from 200 mV to 500 mV, with a span of 300 mV, while the characteristic A has a span of 500 mV. The gain of the second amplifier 73 may thus be preferably set to five thirds of that of the first amplifier 72.

The image pickup device 60 may be connected electric circuitry having various internal noises such as from a power source or due to a minimum resolution, so that the data processor 70 as a previous stage circuit to such the circuitry is needed to amplify associated signals to a maximum permissible level, to thereby improve a signal to noise ratio.

A limitation to such amplification depends on an effective input range. The optimized gains at the amplifiers 72, 73 are determined from such view points. An off-set operation may also be performed independently between the signals 71a, 71b.

The number of amplifiers in the data processor 70 may be increased, as the number of different photo-sensing characteristics increases. A plurality of gains may then be set through a single channel.

Each associated field of time has a blanking period, like the embodiment of FIG. 3. The blanking period may be employed to change a number of circuit factors, such as a gain, in accordance with associated photo-sensing characteristics. A transient instable circuit state, even if caused, will be stabilized within the blanking period.

While the present invention has been described with reference to the particular illustrative embodiment, it is not to be restricted by the embodiment but only by the appended claims. It is to be appreciated that those skilled in the art can change or modify the embodiment without departing from the scope and spirit of the present invention.

What is claimed is:

1. An image pickup device of a solid state type, comprising:

a first photo-sensing element having a first photo-sensing characteristic for sensing a first flux of light to generate a first charge signal consisting of a first quantity of charges;

a second photo-sensing element having a second photo-sensing characteristic for sensing a second flux of light substantially equivalent to said first flux of light to generate a second charge signal consisting of a second quantity of charges different from said first quantity of charges;

a third photo-sensing element having a third photo-sensing characteristic for sensing a third flux of light substantially equivalent to said first flux of light to generate a third charge signal consisting of a third quantity of charges substantially equivalent to said first quantity of charges;

a fourth photo-sensing element having a fourth photo-sensing characteristic for sensing a fourth flux of light substantially equivalent to said first flux of light to generate a fourth charge signal consisting of a fourth quantity of charges substantially equivalent to said second quantity of charges;

a first charge transfer circuit for receiving said first and second charge signals in parallel from said first and second photo-sensing elements, as a first data, and for serially transferring therealong said first data so that said first charge signal follows said second charge signal;

a second charge transfer circuit for receiving said third and fourth charge signals in parallel from said third and fourth photo-sensing elements, as a second data, and for serially transferring therealong said second data so that said third charge signal follows said fourth charge signal; and a third charge transfer circuit for receiving said second charge signal in said first data and said fourth charge signal in said second data in parallel from said first and second charge transfer circuits, as a third data, and serially transferring therealong said third data so that said fourth charge signal follows said second charge signal, and for receiving said first charge signal in said first data and said third charge signal in said second data in parallel from said first and second charge transfer circuits, as a fourth data, and serially transferring therealong said fourth data so that said third charge signal follows said first charge signal.

2. An image pickup device according to claim 1, further comprising an output amplifier for serially receiving said third and fourth data from said third charge transfer circuit, as fifth and sixth data, respectively, and for converting said fifth data into a first signal sequence consisting of a first potential signal representative of said second charge signal in said fifth data and a second potential signal representative of said fourth charge signal in said fifth data, said second potential signal following said first potential signal, and said sixth data into a second signal sequence consisting of a third potential signal representative of said first charge signal in said sixth data and a fourth potential signal representative of said third charge signal in said sixth data, said fourth potential signal following said third potential signal.

3. An image pickup device according to claim 2, further comprising:

an amplifying means for amplifying said first signal sequence with a first gain controlled in accordance with said first photo-sensing characteristic to obtain a first amplified signal sequence, and said second signal sequence with a second gain controlled in accordance with said second photo-sensing characteristic to obtain a second amplified signal sequence; and a processing means for processing said first and second amplified signal sequences to obtain a datastream.

4. An image pickup device according to claim 1, further comprising:

a first drive circuit for generating a first pulse signal to thereby drive said first and second charge transfer circuits; and a second drive circuit for generating a second pulse signal to thereby drive said third charge transfer circuit.

5. An image pickup device according to claim 4, wherein:

said second pulse signal comprises a sequence of drive pulses; and said second drive circuit changes a pulse amplitude of said sequence of drive pulses between a first amplitude for driving said third charge transfer circuit to transfer said third data, said first amplitude depending on said second photo-sensing characteristic, and a second amplitude for driving said third charge transfer circuit to transfer said fourth data, said second amplitude depending on said first photo-sensing characteristic.

6. An image pickup device of a solid-state type, comprising:

M×N photo-sensing elements two-dimensionally arranged in a form of a matrix with M rows and N columns so that an i-th row of said M rows has N elements of said M×N elements and a j-th column of said N columns has hi elements of said M×N elements, respectively, where M and N are predetermined integers larger than unity, respectively, and i and j are arbitrary integers such that $1 \leq i \leq N$ and $1 \leq j \leq M$, respectively;

said N elements of said i-th row having an i-th photo-sensing characteristic for sensing an i-th flux of light to generate an i-th charge signal consisting of an i-th quantity of charges;

said N elements of an (i+1)-th row of said M rows having an (i+1)-th photo-sensing characteristic for sensing an (i+1)-th flux of light substantially equivalent to said i-th flux of light to generate an (i+1)-th charge signal consisting of an (i+1)-th quantity of charges different from said i-th quantity of charges;

N first charge transfer circuits connected to said M×N elements such that a j-th first circuit of said N first charge transfer circuits is connected to said M elements of said j-th column, for receiving therefrom said i-th and (i+1)-th charge signals in parallel as a j-th data and for serially transferring said j-th data along said j-th first circuit so that said i-th charge signal follows said (i+1)-th charge signal, and a (j+1)-th first circuit of said N first charge transfer circuits is connected to said M elements of a (j+1)-th column of said N columns, for receiving therefrom said i-th and (i+1)-th charge signals in parallel as a (j+1)-th data and for serially transferring said (j+1)-th data along said (j+1)-th first circuit so that said i-th charge signal follows said (i+1)-th charge signal; and a second charge transfer circuit connected to said N first charge transfer circuits, for receiving therefrom respective said (i+1)-th charge signals in said j-th and (j+1)-th data in parallel as an (M-i)-th data and serially transferring said (M-i)-th data along said second circuit so that said (i+1)-th charge signal from said j-th data follows said (i+1)-th charge signal from said (j+1)-th data, and for receiving therefrom respective said i-th charge signals in said j-th and (j+1)-th data in parallel as an (M-i+1)-th data and serially transferring said (M-i+1)-th data along said second circuit so that said i-th charge signal from said j-th data follows said i-th charge signal from said (j+1)-th data.

7. An image pickup method by use of a solid-stated set of photo-sensing elements including a first photo-sensing element having a first photo-sensing characteristic for sensing a first flux of light to generate a first charge signal consisting of a first quantity of charges, a second photo-sensing element having a second photo-sensing characteristic for sensing a second flux of light substantially equivalent to said first flux of light to generate a second charge signal consisting of a second quantity of charges different from said first quantity of charges, a third photo-sensing element having a third photo-sensing characteristic for sensing a third flux of light substantially equivalent to said first flux of light to generate a third charge signal consisting of a third quantity of charges substantially equivalent to said first quantity of charges, and a fourth photo-sensing element having a fourth photo-sensing characteristic for sensing a fourth flux of light substantially equivalent to said first flux of light to generate a fourth charge signal consisting of a fourth quantity of charges substantially equivalent to said second quantity of charges, said image pickup method comprising the steps of:

receiving by a first charge transfer circuit said first and second charge signals in parallel from said first and second photo-sensing elements, as a first data;

serially transferring said first data along said first charge transfer circuit so that said first charge signal follows said second charge signal;

receiving by a second charge transfer circuit said third and fourth charge signals in parallel from said third and fourth photo-sensing elements, as a second data;

serially transferring said second data along said second charge transfer circuit so that said third charge signal follows said fourth charge signal;

receiving by a third charge transfer circuit said second charge signal in said first data and said fourth charge signal in said second data in parallel from said first and second charge transfer circuits, as a third data;

serially transferring said third data along said third charge transfer circuit so that said fourth charge signal follows said second charge signal;

receiving by said third charge transfer circuit said first charge signal in said first data and said third charge signal in said second data in parallel from said first and second charge transfer circuits, as a fourth data; and serially transferring said fourth data along said third charge transfer circuit so that said third charge signal follows said first charge signal.

* * * * *